(12) United States Patent
Moon et al.

(10) Patent No.: US 11,991,908 B2
(45) Date of Patent: May 21, 2024

(54) DISPLAY DEVICE HAVING AN EXPANSION PATTERN CONNECTED TO A POWER TRANSFER WIRING

(71) Applicant: Samsung Display Co., Ltd., Yongin-si (KR)

(72) Inventors: Sang-Ho Moon, Cheonan-si (KR); Chungi You, Asan-si (KR); Taejong Eom, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 301 days.

(21) Appl. No.: 17/377,528

(22) Filed: Jul. 16, 2021

(65) Prior Publication Data

US 2022/0115490 A1 Apr. 14, 2022

(30) Foreign Application Priority Data

Oct. 13, 2020 (KR) .................. 10-2020-0132012

(51) Int. Cl.
  *H10K 59/131* (2023.01)
  *G02F 1/01* (2006.01)
  (Continued)

(52) U.S. Cl.
  CPC ......... *H10K 59/131* (2023.02); *G02F 1/0107* (2013.01); *G02F 1/133388* (2021.01);
  (Continued)

(58) Field of Classification Search
  CPC ..................... G02F 1/0102; G02F 1/0107
  See application file for complete search history.

(56) References Cited

U.S. PATENT DOCUMENTS

| 7,791,266 B2 | 9/2010 | Kim |
| 2016/0104757 A1* | 4/2016 | Kim ............... H10K 59/131 |
| | | 438/34 |

(Continued)

FOREIGN PATENT DOCUMENTS

| KR | 10-0721949 | 5/2007 |
| KR | 10-2016-0043574 | 4/2016 |

(Continued)

*Primary Examiner* — Lauren Nguyen
(74) *Attorney, Agent, or Firm* — KILE PARK REED & HOUTTEMAN PLLC

(57) ABSTRACT

A display device includes an array substrate including a pixel array disposed in a display area, an encapsulation substrate, and a sealing member disposed between the array substrate and the encapsulation substrate to combine the array substrate with the encapsulation substrate. The array substrate includes a signal transfer wing overlapping the sealing member and electrically connected to the pixel array, an insulation layer covering the signal transfer wiring and including an inorganic material, a power transfer wiring disposed on the insulation layer, overlapping the sealing member and having a multi-wiring structure, and an expansion pattern connected to the power transfer wiring, having a thickness smaller than an entire thickness of the power transfer wiring and overlapping the sealing member and the signal transfer wiring. An outer edge of the expansion pattern is disposed within a sealing area where the sealing member is disposed.

15 Claims, 21 Drawing Sheets

(51) Int. Cl.
*G02F 1/1333* (2006.01)
*G02F 1/1339* (2006.01)
*G02F 1/1362* (2006.01)
*G02F 1/161* (2006.01)
*G02F 1/1679* (2019.01)
*H10K 50/84* (2023.01)

(52) U.S. Cl.
CPC ...... *G02F 1/1339* (2013.01); *G02F 1/136286* (2013.01); *G02F 1/13629* (2021.01); *G02F 1/161* (2013.01); *G02F 1/1679* (2019.01); *H10K 50/841* (2023.02)

(56) References Cited

U.S. PATENT DOCUMENTS

2017/0141175 A1  5/2017  Park et al.
2019/0348489 A1  11/2019  Na et al.

FOREIGN PATENT DOCUMENTS

KR  10-2017-0057505  5/2017
KR  10-2019-0130707  11/2019

\* cited by examiner

DISPLAY DEVICE HAVING AN EXPANSION PATTERN CONNECTED TO A POWER TRANSFER WIRING

CROSS-REFERENCE TO RELATED APPLICATION

This application claims priority to and the benefit of Korean Patent Application No. 10-2020-0132012, filed on Oct. 13, 2020, which is hereby incorporated by reference for all purposes as if fully set forth herein.

BACKGROUND

Field

Embodiments/implementations of the invention relate generally to a display device and, more specifically, to a display device that has a sealing structure that provides for improved reliability.

Discussion of the Background

A display panel includes an array substrate including a pixel array. The array substrate may be combined with an opposing substrate or an encapsulation substrate to protect the pixel array.

In order to combine the array substrate with the encapsulation substrate, a sealing material such as a glass frit may be disposed between the array substrate and the encapsulation substrate and may be heated by laser. When a metal wiring disposed in a sealing area is heated in a sealing process, a metal component may move outwardly from the metal wiring, or an inorganic layer covering the metal wiring may be damaged, thereby causing defects such as shorts between adjacent metal wirings.

The above information disclosed in this Background section is only for understanding of the background of the inventive concepts, and, therefore, it may contain information that does not constitute prior art.

SUMMARY

Devices constructed/methods according to illustrative implementations of the invention are capable of improved reliability by having a sealing structure that does not break down and result in shorting or other types of defects when subject to heating during a manufacturing of the device.

Embodiments provide a display device with improved reliability.

Additional features of the inventive concepts will be set forth in the description which follows, and in part will be apparent from the description, or may be learned by practice of the inventive concepts.

According to an embodiment, a display device includes an array substrate including a pixel array disposed in a display area, an encapsulation, and a sealing member disposed between the array substrate and the encapsulation substrate to combine the array substrate with the encapsulation substrate. The array substrate includes a signal transfer wing overlapping the sealing member and electrically connected to the pixel array, an insulation layer covering the signal transfer wiring and including an inorganic material, a power transfer wiring disposed on the insulation layer, overlapping the sealing member and having a multi-wiring structure, and an expansion pattern connected to the power transfer wiring, having a thickness smaller than a thickness of the power transfer wiring and overlapping the sealing member and the signal transfer wiring. An outer edge of the expansion pattern is disposed within a sealing area where the sealing member is disposed.

The power transfer wiring may include an upper conductive layer and a lower conductive layer, each of which includes an aluminum layer.

The expansion pattern may be continuously connected to the upper conductive layer of the power transfer wiring.

The signal transfer wiring may include at least molybdenum.

The inorganic insulation layer may include a first portion that contacts the expansion pattern, a second portion that contacts the sealing member, and a third portion that contacts the power transfer wiring. A thickness of the first portion is larger than a thickness of the second portion and smaller than a thickness of the third portion.

A thickness difference of the first portion and the second portion may be at least 500 Å.

The outer edge of the expansion pattern may extend along an outer edge of the sealing area.

The power transfer wiring may include a first wiring portion, which is disposed in a peripheral area between the display area and the sealing area, and a second wiring portion vertically spaced apart from the first wiring portion by an organic insulation layer.

The expansion pattern may be continuously connected to the first wiring portion.

The expansion pattern may be spaced apart from the first wiring portion to define a slit, which exposes a portion of the organic insulation layer.

A portion of the expansion pattern may be disposed on the organic insulation layer.

The array substrate may further include an edge metal pattern, which extends along a direction crossing an extending direction of the expansion pattern and overlaps the sealing member. The edge metal pattern may be connected to the expansion pattern in a corner area of the array substrate.

The pixel array may include an organic light-emitting diode.

The signal transfer wiring may transfer a data signal to the pixel array.

The power bus wiring may transfer a power voltage to the pixel array.

According to an embodiment, a display device includes an array substrate including a pixel array disposed in a display area, an encapsulation substrate, and a sealing member disposed between the array substrate and the encapsulation substrate to combine the array substrate with the encapsulation substrate. The array substrate includes a signal transfer wing overlapping the sealing member and electrically connected to the pixel array, an insulation layer covering the signal transfer wiring and including an inorganic material, a power transfer wiring disposed on the insulation layer and overlapping the sealing member, and an expansion pattern disposed on the power transfer wiring, including a material different from the power transfer wiring and overlapping the sealing member and the signal transfer wiring.

According to embodiments, damage to an inorganic layer covering a metal wiring in a sealing area may be reduced or prevented. Thus, a short between adjacent metal wirings in the sealing area may be prevented.

It is to be understood that both the foregoing general description and the following detailed description are exemplary illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concept.

DETAILED DESCRIPTION

Figure 1:
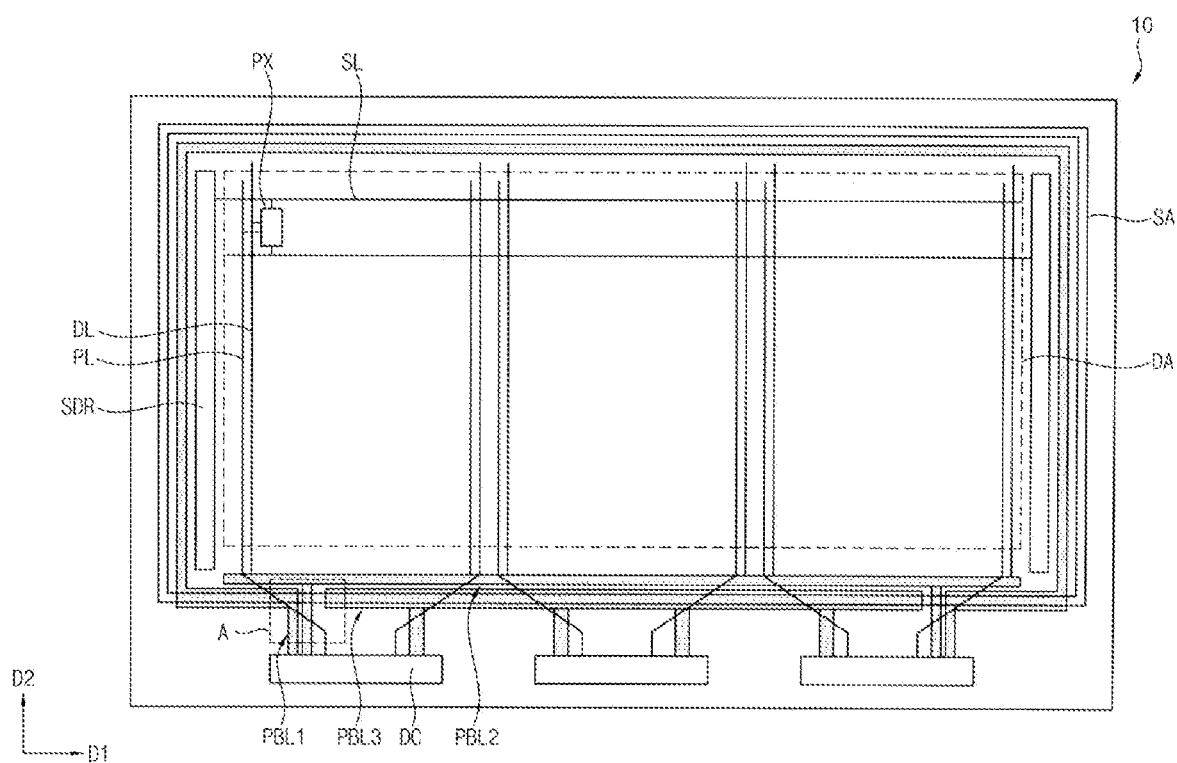
FIG. 1 is a plan view illustrating a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display device and a method for manufacturing a display device according to embodiments of the present inventive concept will be described hereinafter with reference to the accompanying drawings, in which some embodiments are shown.

Figure 2:
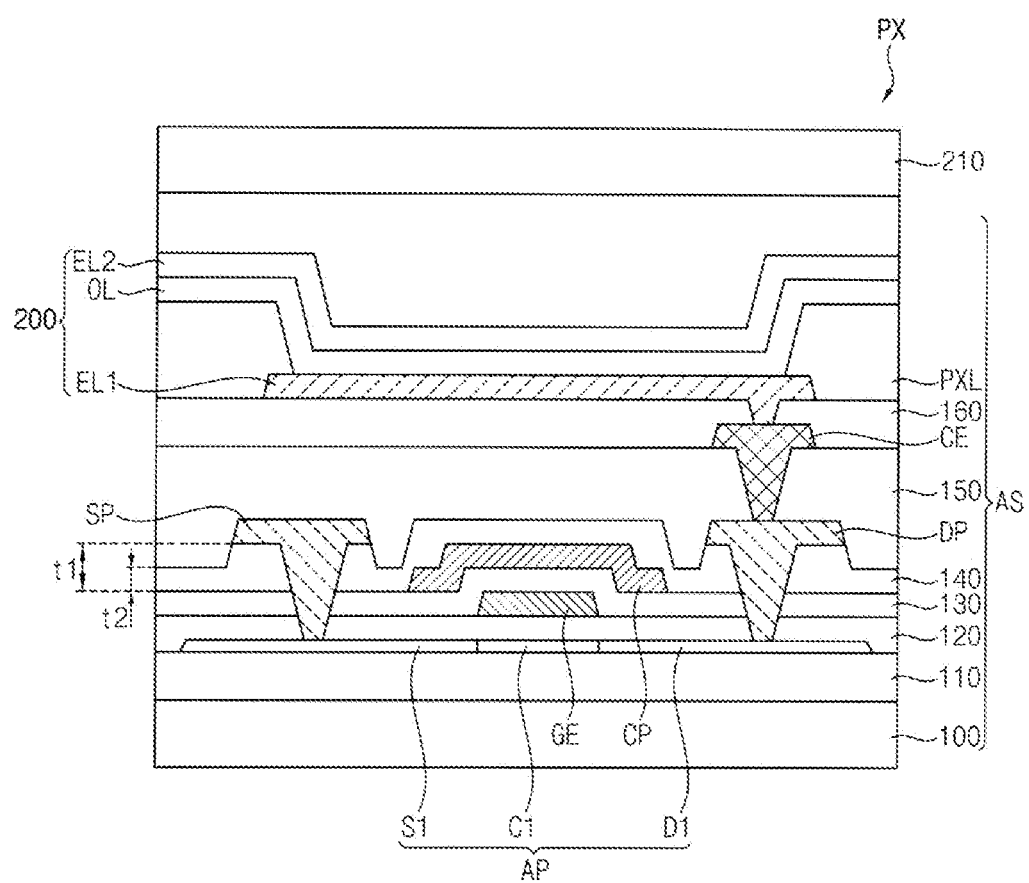
FIG. 2 is a cross-sectional view illustrating a display area of a display device according to an embodiment.
Figure 3:
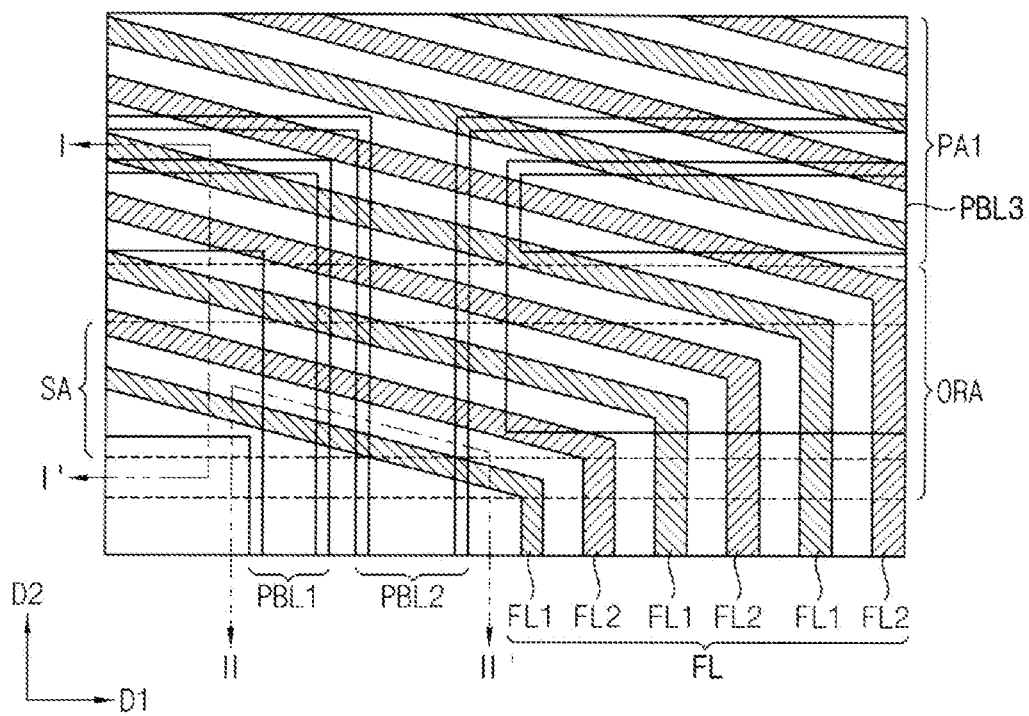
FIG. 3 is an enlarged plan view illustrating a sealing area of a display device according to an embodiment.
Figure 4A:
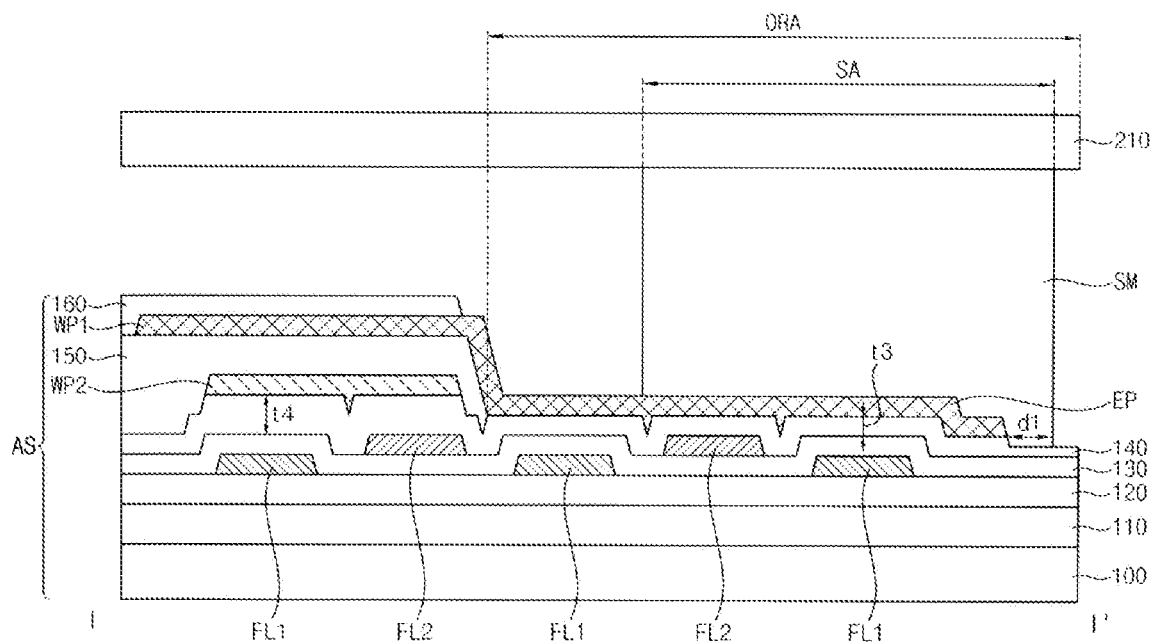
FIG. 4A is a cross-sectional view taken along the line I-I' of FIG. 3.
Figure 4B:
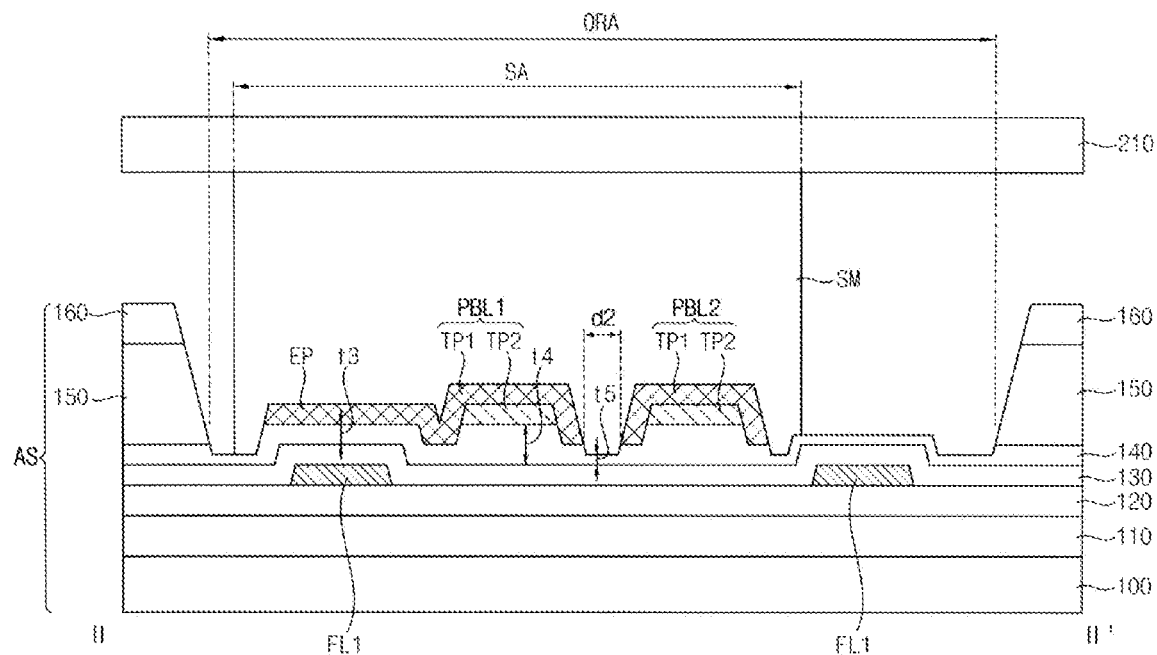
FIG. 4B is a cross-sectional view taken along the line II-II' of FIG. 3.

FIG. 1 is a plan view illustrating a display device according to an embodiment that is constructed according to principles of the invention. FIG. 2 is a cross-sectional view illustrating a display area of a display device according to an embodiment. FIG. 3 is an enlarged plan view illustrating a sealing area of a display device according to an embodiment. FIG. 4A is a cross-sectional view taken along the line I-I' of FIG. 3. FIG. 4B is a cross-sectional view taken along the line II-II' of FIG. 3.

Referring to FIG. 1, a display device 10 includes a display area DA and a peripheral area surrounding or adjacent to the display area DA. The display area DA may generate a light or may adjust transmittance of a light provided by an external light source to display an image. The peripheral area may be defined as an area not displaying an image.

In an embodiment, the display device 10 may include or may be an organic light-emitting display panel. For example, an array of pixels PX including a light-emitting element may be disposed in the display area DA to generate a light in response to a driving signal. A signal wiring and a power wiring may be disposed in the display area DA to transfer a driving signal and a power voltage to the pixels PX. For example, a gate line SL, a data line DL and a power line PL may be disposed in the display area DA. The gate line SL may extend along a first direction D1 and may provide a gate signal to the pixels PX. The data line DL may extend along a second direction D2 crossing the first direction D1 and may provide a data signal to the pixels PX. The power line PL may extend along the second direction D2 and may provide a power voltage to the pixels PX.

A transfer wiring, a circuit part or the like may be disposed in the peripheral area. The transfer wiring may transfer a driving signal or a power to the display area DA. The circuit part may generate a driving signal. For example, a scan driver SDR generating the gate signal, a fan-out wiring FL transferring the data signal to the data line DL, a first power bus wiring PBL1 transferring a first power voltage to the pixels PX and a second power bus wiring PBL2 transferring a second power voltage to the power line PL or the like may be disposed in the peripheral area.

In an embodiment, the first power bus wiring PBL1, the second power bus wiring PBL2 and the fan-out wiring FL may extend to a side of the display device 10. The first power bus wiring PBL1, the second power bus wiring PBL2 and the fan-out wiring may be electrically connected to a driving device DC such as a driving chip, a printed circuit board through a connection pad disposed on the side of the display device 10 to receive a driving signal or a power voltage from the driving device DC. An area where the wirings are connected to the driving device DC may be referred to as a connection area.

For example, the driving device DC may include a driving chip bonded to a display panel. However, embodiments are not limited thereto. For example, the driving device DC may include a printed circuit board with a driving chip mounted thereto, a flexible printed circuit board with a driving chip mounted thereon or the like. In an embodiment, the driving device DC may be disposed on an upper surface of the display panel. However, embodiments are not limited thereto. For example, the display device may be disposed on a rear surface of the display panel and electrically connected to the wirings through a connection member and a connection pad.

In an embodiment, the first power bus wiring PBL1 may transfer the first power voltage to a cathode of an organic light-emitting diode. The second power bus wiring PBL2 may transfer the second power voltage to a driving element of the pixels PX. The driving element may provide a driving voltage to the organic light-emitting diode based on the second power voltage. Different constant voltages may be applied to the first power bus wiring PBL1 and the second power bus wiring PBL2.

In an embodiment, the display device 10 may further include a third power bus wiring PBL3. The third power bus wiring PBL3 may transfer the first power voltage to the pixels PX. For example, the first power bus wiring PBL1 may extend to surround the display area DA. The third power bus wiring PBL3 may be disposed in an area where the first power bus wiring PBL1 is not disposed. For example, the second power bus wiring PBL2 and the third power bus wiring PBL3 may extend along a first direction D1 on a side of the display device 10. Thus, the first power voltage may be uniformly applied to the pixels in the display device 10 having a longer side extending along the first direction D1.

In an embodiment, the third power bus wiring PBL3 may include a branch portion extending along the second direction D2 crossing the first direction D1 and electrically connected to the driving device DC. For example, the third power bus wiring PBL3 may be electrically connected to the driving device DC to receive the first power voltage.

In an embodiment, the display device 10 may include a sealing area SA where a sealing member is disposed. The sealing area SA may surround the display area DA, in a plan view. At least a portion of the first power bus wiring PBL1, the second power bus wiring PBL2 and the third power bus wiring PBL3 may be disposed in the sealing area SA. For example, a portion of the first power bus wiring PBL1, the second power bus wiring PBL2 and the third power bus wiring PBL3 may extend along the second direction D2 to cross the sealing area SA. In an embodiment, at least a portion of the second power bus wiring PBL2 may be disposed between the first power bus wiring PBL1 and the display area DA or between the third power bus wiring PBL3 and the display area DA.

Referring to FIG. 2, a display device 10 includes an array substrate AS and an encapsulation substrate 210. An array of pixels PX is disposed in a display area DA of the array substrate AS. Each of the pixels PX may include a driving element disposed on a base substrate 100, and a light-emitting element electrically connected to the driving element. In an embodiment, the driving element may be an organic light-emitting diode (OLED).

A buffer layer 110 may be disposed on the base substrate 100. An active pattern AP may be disposed on the buffer layer 110.

For example, the base substrate 100 may include glass, quartz, sapphire, a polymeric material or the like. In an embodiment, the base substrate 100 may include a transparent rigid material such as glass.

The buffer layer 110 may prevent or reduce permeation of impurities, humidity or external gas from underneath of the base substrate 100, and may reduce a roughness of an upper surface of the base substrate 100. For example, the buffer layer 110 may include an inorganic material such as silicon oxide, silicon nitride, silicon oxynitride or the like.

A first gate metal pattern including a gate electrode GE may be disposed on the active pattern AP. A first insulation layer 120 may be disposed between the active pattern AP and the gate electrode GE.

A second gate metal pattern including a capacitor electrode pattern CP may be disposed on the gate electrode GE. The capacitor electrode pattern CP may include a capacitor electrode for forming a capacitor, a wiring transferring a scan signal or the like.

A second insulation layer 130 may be disposed between the first gate metal pattern and the second gate metal pattern. A third insulation layer 140 may be disposed on the second gate metal pattern.

For example, the active pattern AP may include silicon or a metal oxide semiconductor. In an embodiment, the active pattern AP may include polycrystalline silicon (polysilicon), which may be doped with n-type impurities or p-type impurities.

In another embodiment or in another transistor that is formed from an active pattern that is not illustrated in FIG. 2, an active pattern may include a metal oxide semiconductor. For example, the active pattern may include a binary compound ($AB_x$), a ternary compound ($AB_xC_y$) or a quaternary compound ($AB_xC_yD_z$), which contains indium (In), zinc (Zn), gallium (Ga), tin (Sn), titanium (Ti), aluminum (Al), hafnium (Hf), zirconium (Zr), magnesium (Mg). For example, the active pattern may include zinc oxide ($ZnO_x$), gallium oxide ($GaO_x$), titanium oxide ($TiO_x$), tin oxide ($SnO_x$), indium oxide ($InO_x$), indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($ZnZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO) or the like.

For example, the active pattern AP may include a channel region C1 overlapping the gate electrode GE, a source region S1 and a drain region D1. The source region S1 and the drain region D1 may have a greater conductivity than the channel region C1. For example, the source region S1 and the drain region D1 may be formed by doping impurities with higher concentration.

The first insulation layer 120, the second insulation layer 130 and the third insulation layer 140 may each include silicon oxide, silicon nitride, silicon oxynitride or a combination thereof. Furthermore, the first insulation layer 120, the second insulation layer 130 and the third insulation layer 140 may each include an insulating metal oxide such as aluminum oxide, tantalum oxide, hafnium oxide, zirconium oxide, titanium oxide or the like. For example, the first insulation layer 120, the second insulation layer 130 and the third insulation layer 140 may each have a single-layered structure or a multi-layered structure including silicon nitride and/or silicon oxide, or may have different structures from each other.

The first gate metal pattern and the second gate metal pattern may each include a metal, a metal alloy, a metal nitride, a conductive metal oxide or the like. For example, the first gate metal pattern and the second gate metal pattern may each include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta) or an alloy thereof, and may have a single-layered structure or a multi-layered structure including different metal layers.

A first source metal pattern may be disposed on the third insulation layer 140. The first source metal pattern may include a source pattern SP and a drain pattern DP, which electrically contact the active pattern AP. The source pattern SP and the drain pattern DP may pass through the insulation layers thereunder to contact the source region S1 and the drain region D1 of the active pattern AP, respectively. The first source metal pattern may further include a mesh power line or the like.

In an embodiment, the third insulation layer 140, which is disposed under the first source metal pattern and covers the second gate metal pattern, may have a thickness that varies over a length of the third insulation layer 140. In an embodiment, a thickness t1 of a portion of the third insulation layer 140, which overlaps the first source metal pattern, may be larger than a thickness t2 of a portion of the third insulation layer 140, which does not overlap the first source metal pattern. In an embodiment, a difference between the thicknesses t1 and t2 may be at least 500 Å. For example, a difference between the thicknesses t1 and t2 may be about 500 Å to about 1,500 Å.

A fourth insulation layer 150 may be disposed on the first source metal pattern. A second source metal pattern may be disposed on the fourth insulation layer 150. The second source metal pattern may include a connection electrode CE. For example, the second source metal pattern may further include at least one of a data lien and a power line. A fifth insulation layer 160 may be disposed on the second source metal pattern.

The first source metal pattern and the second source metal pattern may each include a metal, a metal alloy, a metal nitride, a conductive metal oxide or the like. For example, the first source metal pattern and the second source metal patterns may each include Au, Ag, Al, Cu, Ni, Pt, Mg, Cr, W, Mo, Ti, Ta or an alloy thereof, and may have a single-layered structure or a multi-layered structure including different metal layers. In an embodiment, the first source metal pattern and the second source metal patterns may each have a multi-layered structure including aluminum. For example, the first source metal pattern and the second source metal patterns may each have a double-layered structure or a triple-layered structure, which includes an aluminum layer and a titanium layer.

The fourth insulation layer 150 and the fifth insulation layer 160 may include an organic material. For example, the fourth insulation layer 150 and the fifth insulation layer 160 may each include an organic insulation material such as a phenol resin, an acryl resin, a polyimide resin, a polyamide resin, a siloxane resin, an epoxy resin or the like.

An organic light-emitting diode 200 may be disposed on the fifth insulation layer 160. The organic light-emitting diode 200 may include a first electrode EL1 electrically connected to the connection electrode CE, an organic light-emitting layer OL disposed on the first electrode EL1 and a second electrode EL2 disposed on the organic light-emitting layer OL. The organic light-emitting layer OL of the organic light-emitting diode 200 may be disposed at least in an opening of a pixel-defining layer PDL disposed on the fifth insulation layer 160. The first electrode EL1 may be a lower electrode of the organic light-emitting diode 200, and the second electrode EL2 may be an upper electrode of the organic light-emitting diode 200.

The first electrode EL1 may function as an anode. For example, the first electrode EL1 may be formed as a transmitting electrode or a reflecting electrode according to an emission type of the display device. When the first electrode EL1 is a transmitting electrode, the first electrode EL1 may include indium tin oxide, indium zinc oxide, zinc tin oxide, indium oxide, zinc oxide, tin oxide or the like. When the first electrode EL1 is a reflecting electrode, the first electrode EL1 may include Au, Ag, Al, Cu, Ni, Pt, Mg, Cr, W, Mo, Ti or a combination thereof, and may have a stacked structure further including the material that may be used for the transmitting electrode. For example, the first electrode EL1 may have a stacked structure of ITO/Ag/ITO.

The pixel-defining layer PDL has the opening overlapping at least a portion of the first electrode EL1. For example, the pixel-defining layer PDL may include an organic insulating material.

The organic light-emitting layer OL may include at least a light-emitting layer, and may further include at least one of a hole injection layer (HIL), a hole transporting layer (HTL), an electron transporting layer (ETL) and an electron injection layer (EIL). The organic light-emitting layer OL may include a low molecular weight organic compound or a polymeric organic compound. In an embodiment, the organic light-emitting layer OL may include at least one layer formed as a common layer extending continuously over a plurality of pixels in the display area DA. However, embodiments are not limited thereto. For example, the organic light-emitting layer OL may be formed as an isolated pattern disposed in each of pixels and may be formed through an inkjet printing process.

In an embodiment, the organic light-emitting layer OL may emit a red light, a green light or a blue light. In another embodiment, the organic light-emitting layer OL may emit a white light. The organic light-emitting layer OL emitting a white light may have a multi-layer structure including a red-emitting layer, a green-emitting layer and a blue-emitting layer, or a single-layer structure including a mixture of a red-emitting material, a green-emitting material and a blue-emitting material.

The second electrode EL2 may function as a cathode. The second electrode EL2 may be formed as a transmitting electrode or a reflecting electrode according to an emission type of the display device. For example, the second electrode EL2 may include a metal, a metal alloy, a metal nitride, a metal fluoride, a conductive metal oxide or a combination thereof.

For example, the second electrode EL2 may be formed as a common layer extending continuously over a plurality of pixels in the display area DA.

An encapsulation substrate 210 is disposed on the organic light-emitting diode 200. For example, the encapsulation substrate 210 may include glass, quartz, sapphire, a polymeric material or the like. In an embodiment, the encapsulation substrate 210 may include a transparent rigid material such as glass.

For example, a spacer may be disposed under the encapsulation substrate 210 to support the encapsulation substrate 210. In an embodiment, the spacer may be disposed between the encapsulation substrate 210 and the pixel-defining layer PDL or between the second electrode EL2 and the pixel-defining layer PDL.

A space between the encapsulation substrate 210 and the organic light-emitting diode 200 may have a vacuum state or may be filled with a gas or a sealing material. The sealing material may include an organic layer, an inorganic layer or a combination thereof.

Referring to FIGS. 3, 4A and 4B, the first power bus wiring PBL1, the second power bus wiring PBL2 and the third power bus wiring PBL3 may overlap a first peripheral area PA1 between the sealing area SA and the display area DA. For example, at least a portion of each of the first power bus wiring PBL1, the second power bus wiring PBL2 and the third power bus wiring PBL3 may extend along the first direction D1 in the first peripheral area PA1.

For example, the sealing area SA may be defined as an area where a sealing member SM is disposed. At least a portion of each of the first power bus wiring PBL1, the second power bus wiring PBL2 and the third power bus wiring PBL3 may be disposed in the sealing area SA. For example, For example, a portion of each of the first power bus wiring PBL1, the second power bus wiring PBL2 and the third power bus wiring PBL3 may extend along the second direction D2 crossing the first direction D1 to cross the sealing member SM.

In an embodiment, an organic layer may be removed in the sealing area SA. For example, the fourth insulation layer 150 and the fifth insulation layer 160 may be removed in the sealing area SA. Thus, the sealing member SM may contact the power transfer wirings and may contact an inorganic layer where the power transfer wirings are not disposed. An organic-removed area ORA, which is defined as an area where an organic layer is removed, may preferably have a width larger than a width of the sealing member SM so that the sealing member SM may be sufficiently spaced apart from an adjacent organic layer in a lateral direction.

A fan-out wiring FL may be disposed in the first peripheral area PA1 and the sealing area SA. For example, the fan-out wiring FL may include a first fan-out line FL1 and a second fan-out line FL2, which are disposed in different layers and alternately arranged. In an embodiment, the first fan-out wiring FL1 may be formed from a same layer as the first gate metal pattern, and the second fan-out wiring FL2 may be formed from a same layer as the second gate metal pattern. Thus, the first fan-out wiring FL1 may be disposed between the first insulation layer 120 and the second insulation layer 130, and the second fan-out wiring FL2 may be disposed between the third insulation layer 140 and the second insulation layer 130.

The fan-out wiring FL may be referred to as a signal-transfer wiring. In embodiments, the signal-transfer wiring is not limited to the fan-out wiring FL. For example, the signal-transfer wiring may transfer other signals than a data signal, or may have a different shape from the fan-out wiring FL.

In an embodiment, the power bus wirings may have a multi-wiring structure such as a double-wiring structure. For example, the first power bus wiring PBL1 may include a first wiring portion WP1 and a second wiring portion WP2, which are disposed in the first peripheral area PA1. The first wiring portion WP1 may be disposed on the second wiring portion WP2. The first power bus wiring PBL1 may include a first transfer portion TP1 and a second transfer portion TP2, which are disposed in the sealing area SA.

The first wiring portion WP1 and the first transfer portion TP1 may be disposed in a same layer, and may be continuously connected to each other. The second wiring portion WP2 and the second transfer portion TP2 may be disposed in a same layer, and may be continuously connected to each other. The fourth insulation layer 150 may be disposed between the first wiring portion WP1 and the second wiring portion WP2. Because an organic layer is removed in the sealing area SA, the first transfer portion TP1 may contact the second transfer portion TP2. The first transfer portion TP1 may entirely cover an upper surface of the second transfer portion TP2.

The second power bus wiring PBL2 and the third power bus wiring PBL3 may have a double-wiring structure similar to the first power bus wiring PBL1. For example, the second power bus wiring PBL2 may include a first transfer portion TP1 and a second transfer portion TP2, which are disposed in the sealing area SA.

In an embodiment, because the power bus wirings may have a double-wiring structure, reliability of the power bus wirings may be improved, and resistance of the power bus wirings may be reduced. For example, the first wiring portion WP1 and the first transfer portion TP1 may be referred to as an upper conductive layer or a first conductive layer, and the second wiring portion WP2 and the second transfer portion TP2 may be referred to as a lower conductive layer or a second conductive layer. For example, The upper conductive layer and the lower conductive layer may each include an aluminum layer and a titanium layer. For example, the upper conductive layer and the lower conductive layer may each include a lower titanium layer, an aluminum layer and an upper titanium layer, which are sequentially stacked. Thus, the first power bus wiring PBL1 may include at least two aluminum layers, which are entirely spaced apart from each other.

For example, the first wiring portion WP1 and the first transfer portion TP1 may be formed from a same layer as the second source metal pattern. The second wiring portion WP2 and the second transfer portion TP2 may be formed from a same layer as the first source metal pattern.

The first power bus wiring PBL1 may be spaced apart from the second power bus wiring PBL2 by a predetermined distance. For example, a distance d2 between the first power bus wiring PBL1 and the second power bus wiring PBL2 in the sealing area SA may be at least about 100 μm, and may be preferably at least about 200 μm. When a distance between the first power bus wiring PBL1 and the second power bus wiring PBL2 in the sealing area SA is excessively small, shorts between the first power bus wiring PBL1 and the second power bus wiring PBL2 may be caused by metal residues, which may remain along the fan-our wiring FL.

In an embodiment, the array substrate AS may include an expansion pattern EP covering an inorganic layer, which overlaps the sealing member SM.

In an embodiment, the expansion pattern EP may be formed from a same layer as at least a portion of the power bus wirings. For example, the expansion pattern EP may be formed from a same layer as the upper conductive layer of the first power bus wiring PBL1, and may be connected continuously to at least one of the first wiring portion WP1 and the first transfer portion TP1.

The expansion pattern EP overlaps at least a portion of the sealing member SM. For example, the expansion pattern EP may cover the fan-out wiring FL in the sealing area SA.

In an embodiment, the first source metal pattern and the second source metal pattern may be formed by a dry-etching process. When the first source metal pattern and the second source metal pattern are dry-etched, an inorganic layer may be etched in an area that is not covered by a photoresist pattern. For example, when the expansion pattern EP does not exist, the third insulation layer 140 may be etched in a portion of the sealing area SA, where the power bus wirings are not disposed, so that a thickness of the third insulation layer 140 may be reduced. When a thickness of the third insulation layer 140 covering the fan-out wiring FL is reduced, an inorganic layer such as the third insulation layer 140 may be damaged or lifted by a thermal stress in the process of forming the sealing member SM thereby causing a short of the fan-out wiring FL.

Referring to FIGS. 4A and 4B, a thickness t3 of a first portion of the third insulation layer 140, which contacts the expansion pattern EP in the sealing area SA, may be larger than a thickness t5 of a second portion of the third insulation layer 140, which contacts the sealing member SM. In an embodiment, a thickness difference of the first portion and the second portion may be at least about 500 Å.

For example, the thickness t3 of the first portion of the third insulation layer 140, which contacts the expansion pattern EP, may be substantially same as a thickness t2 of a portion of the third insulation layer 140, which does not overlap the first source metal pattern in the pixel area. The thickness t3 of the first portion of the third insulation layer 140 may be smaller than a thickness t4 of a third portion of the third insulation layer 140, which contacts the second wiring portion WP2 or the second transfer portion TP2 of the power bus wirings.

In an embodiment, the expansion pattern EP may be spaced apart from an outer edge of the sealing member SM. For example, an outer edge of the expansion pattern EP may be within the sealing area SA where the sealing member SM is disposed, in a plan view. For example, the outer edge of the expansion pattern EP may extend along an edge of the sealing area SA.

When the expansion pattern EP is exposed outside the sealing area SA, the expansion pattern EP may be damaged by corrosion or the like. For example, a distance between the outer edge of the sealing member SM and the outer edge of the expansion pattern EP may be about 100 μm to about 200 μm. Thus, the sealing member SM may cover a side surface of the outer edge of the expansion pattern EP.

FIGS. 5A, 5B, 5C, 6A, 6B, 6C, 7A, 7B, 7C, 8A, 8B, 8C, 9 and 10 are cross-sectional views illustrating a method for manufacturing a display device according to an embodiment. FIGS. 5A, 6A, 7A, 8A and 9 may show a pixel area, and FIGS. 5B, 5C, 6B, 6C, 7B 7C, 8B, 8C and 10 may show a sealing area and a peripheral area adjacent thereto.

Figure 5A:
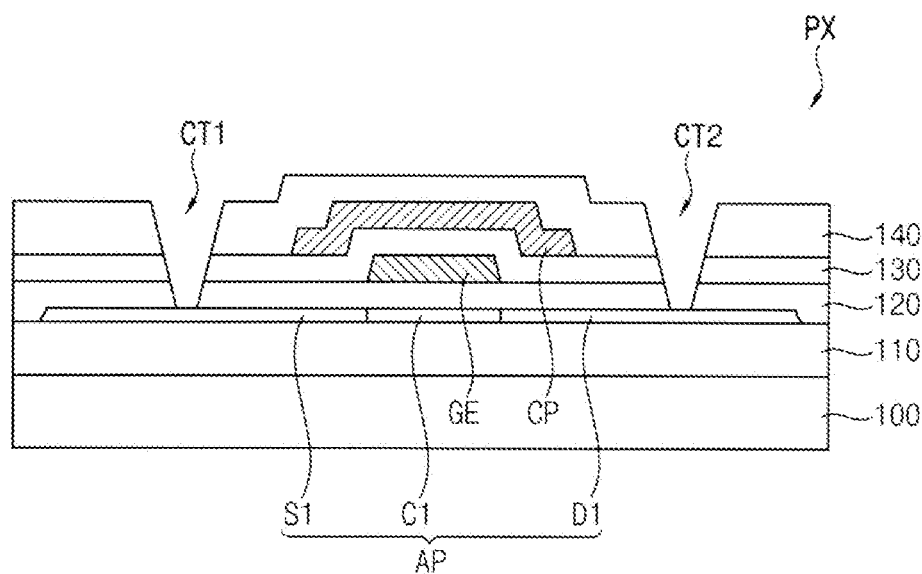
FIG. 5A, FIG. 5B, FIG. 5C, FIG. 6A, FIG. 6B, FIG. 6C, FIG. 7A, FIG. 7B, FIG. 7C, FIG. 8A, FIG. 8B, FIG. 8C, FIG. 9 and FIG. 10 are cross-sectional views illustrating a method for manufacturing a display device according to one or more embodiments.

Referring to FIG. 5A, a buffer layer 110 is formed on a base substrate 100. An active pattern AP is formed on the buffer layer 110 in a pixel area PX. A first insulation layer 120 is formed on the active pattern AP. A first gate metal pattern including a gate electrode GE is formed on the first insulation layer 120. A second insulation layer 130 is formed on the first gate metal pattern. A second gate metal pattern including a capacitor electrode pattern CP is formed on the second insulation layer 130. A third insulation layer 140 is formed on the second gate metal pattern.

The insulation layers are patterned to form contact holes CT1 and CT2 exposing the active pattern AP. For example, the first insulation layer 120, the second insulation layer 130 and the third insulation layer 140 may be partially removed to form the contact holes CT1 and CT2.

Figure 5B:
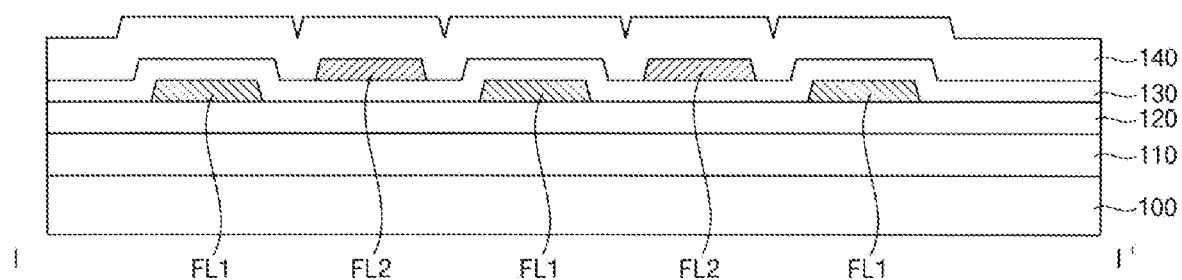
Figure 5C:
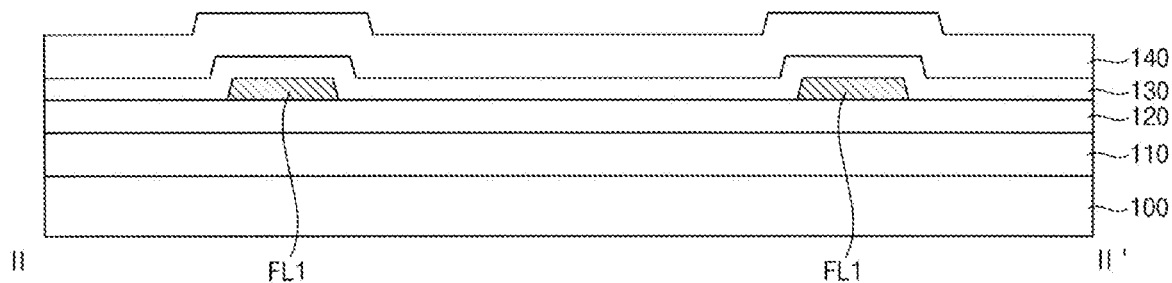

Referring to FIGS. 5B and 5C, the buffer layer 110, the first insulation layer 120, the second insulation layer 130 and the third insulation layer 140 may extend to a sealing area and a peripheral area. A first fan-out line FL1 and a second fan-out line FL2 are disposed in the sealing area and the peripheral area. The first fan-out line FL1 may be formed from a same layer as the first gate metal pattern. The second fan-out line FL2 may be formed from a same layer as the second gate metal pattern.

Figure 6A:
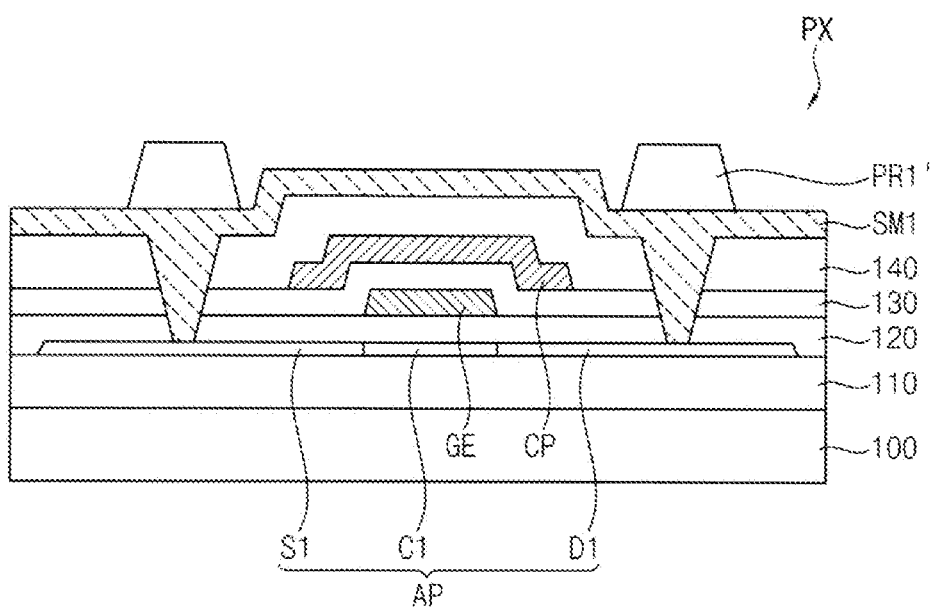
Figure 6B:
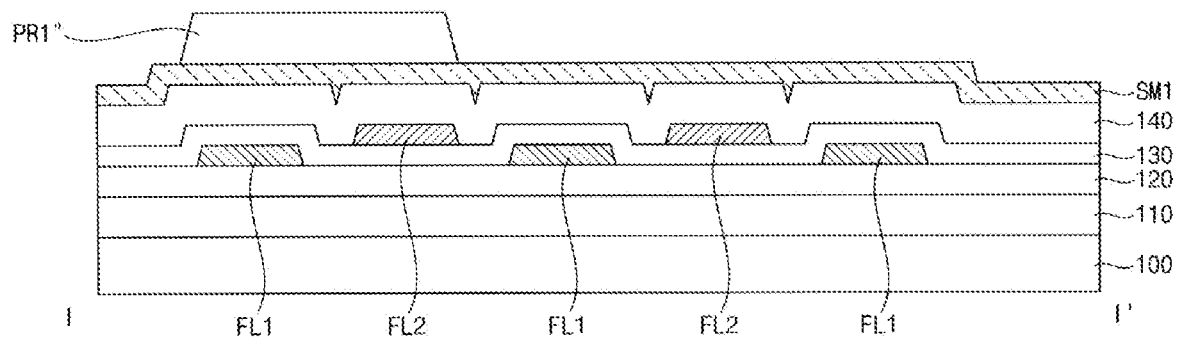
Figure 6C:
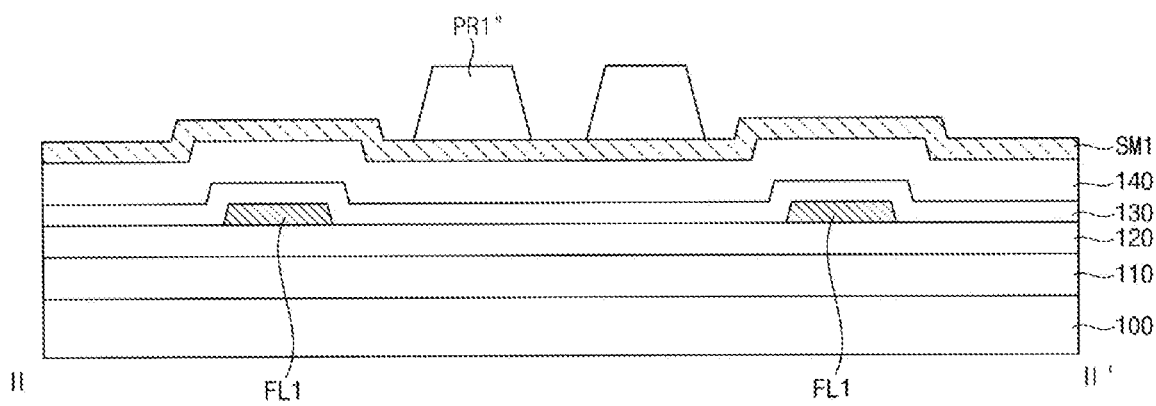

FIGS. 6A, 6B and 6C, a first source metal layer SM1 is formed on the third insulation layer 140. A first photoresist pattern is formed on the first source metal layer SM1. A first portion PR1' of the first photoresist pattern may be disposed in the pixel area PX and may overlap the active pattern AP. A second portion PR1" of the first photoresist pattern may be disposed in the peripheral area and the sealing area.

Figure 7A:
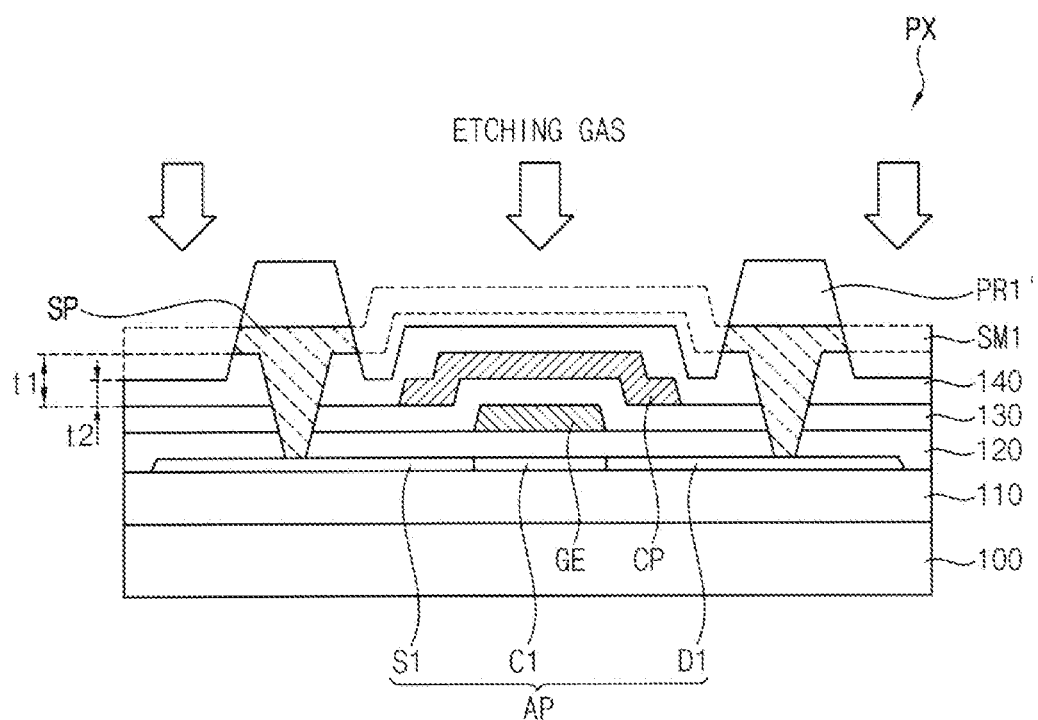
Figure 7B:
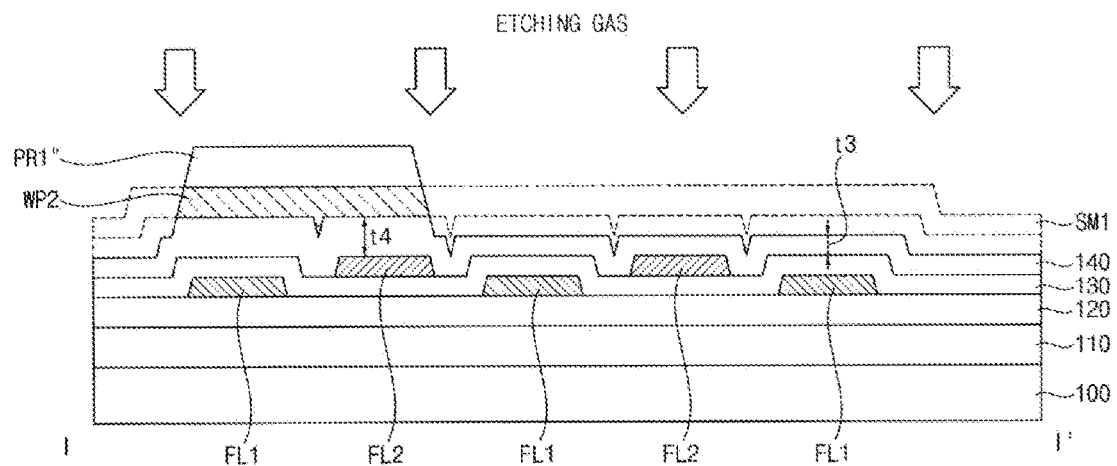
Figure 7C:
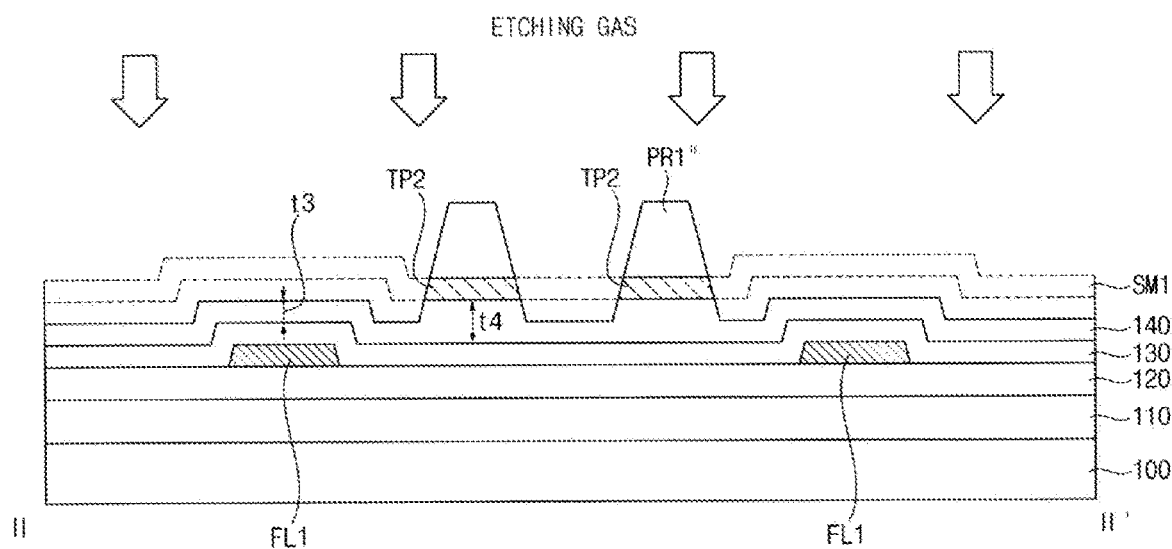

Referring to FIGS. 7A, 7B and 7C, the first source metal layer SM1 is etched by using the first photoresist pattern as a mask. As a result, a first source metal pattern, which includes a source pattern SP, a drain pattern DP and a lower conductive layer of a power transfer wiring, may be formed. The source pattern SP and the drain pattern DP may each electrically contact the active pattern AP, and may be spaced apart from each other. The lower conductive layer of the power transfer wiring may include a second wiring portion WP2 and a second transfer portion TP2. The second wiring portion WP2 may overlap the peripheral area, and the second transfer portion TP2 may overlap the sealing area.

The first source metal layer SM1 may be dry-etched by using an etching gas. After a portion of the first source metal layer SM1 is removed, an insulation layer disposed under the portion of the first source metal layer SM1 may be further etched. As a result, a thickness t1 of a portion of the third insulation layer 140, which overlaps the first source metal pattern in the pixel area PX, may be larger than a thickness t2 of a portion of the third insulation layer 140, which does not overlap the first source metal pattern in the pixel area PX. Furthermore, a thickness t4 of a portion of the third insulation layer 140, which overlaps the first source metal pattern in the peripheral area, may be larger than a thickness t3 of a portion of the third insulation layer 140, which does not overlap the first source metal pattern in the peripheral area.

Figure 8A:
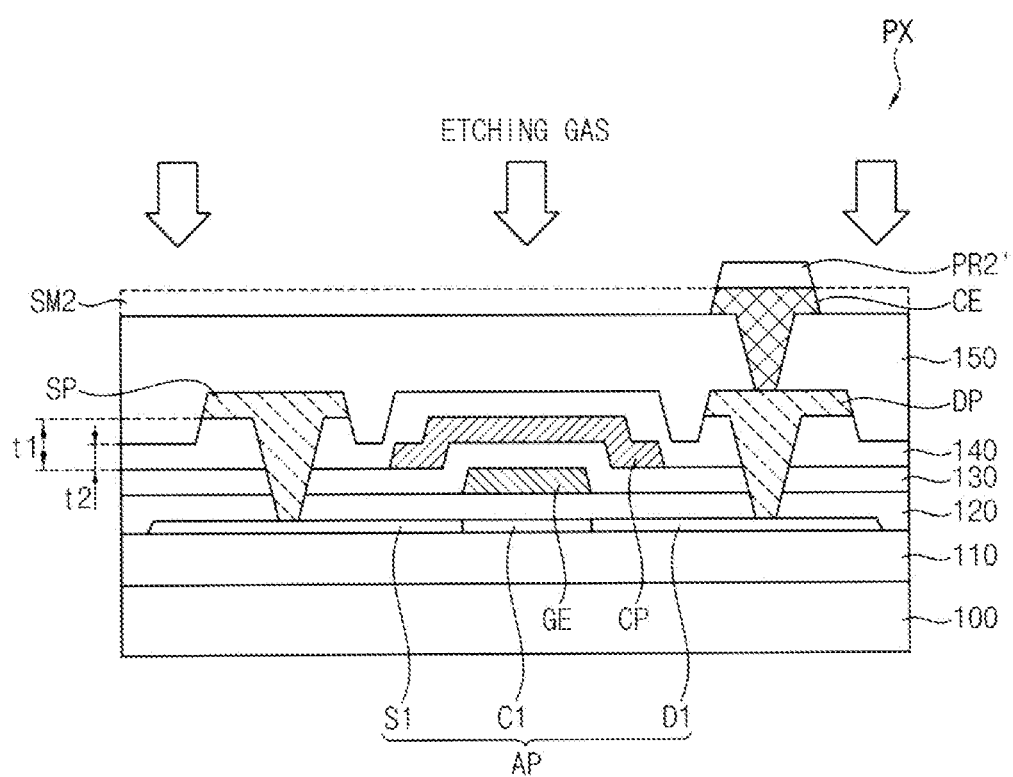
Figure 8B:
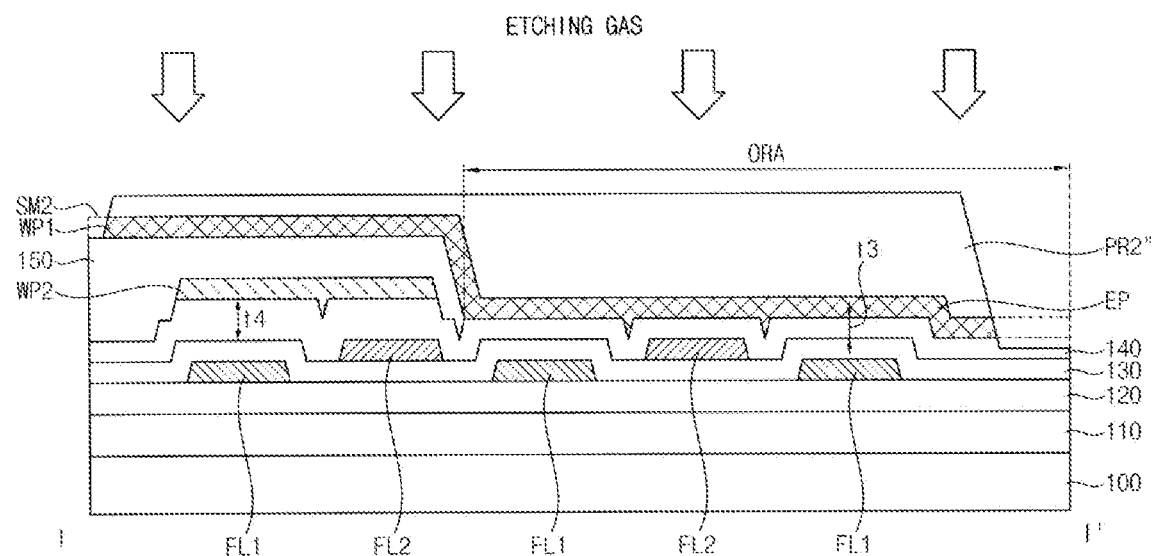
Figure 8C:
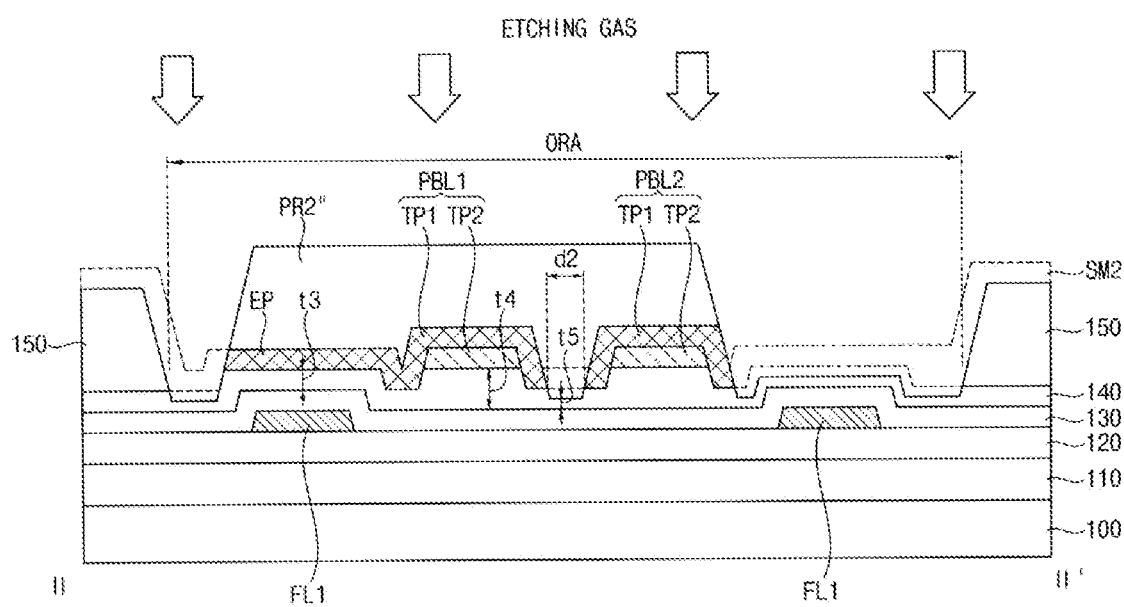

Referring to FIGS. 8A, 8B and 8C, a fourth insulation layer 150 is formed to cover the first source metal pattern. In an embodiment, the fourth insulation layer 150 may be partially removed in the peripheral area and the sealing area to form an organic-removed area ORA. The fourth insulation layer 150 may cover the second wiring portion WP2.

A second source metal layer SM2 is formed on the fourth insulation layer 150. A second photoresist pattern is formed on the second source metal layer SM2. A first portion PR2' of the second photoresist pattern may be disposed in the pixel area PX to overlap the drain pattern DP. A second portion PR2" of the second photoresist pattern may overlap the lower conductive layer of the power transfer wiring.

The second source metal layer SM2 is etched by using the second photoresist pattern as a mask. As a result, a second source metal pattern including a connection electrode CE and an upper conductive layer of the power transfer wiring may be formed.

The connection electrode CE may electrically contact the drain pattern DP. The upper conductive layer of the power transfer wiring may include a first wiring portion WP1 and a first transfer portion TP1. The first wiring portion WP1 may be disposed on the fourth insulation layer 150 to be spaced apart from the second wiring portion WP2 by the fourth insulation layer 150. The first transfer portion TP1 may contact the second transfer portion TP2. For example, the first transfer portion TP1 may cover an upper surface and a side surface of the second transfer portion TP2.

In an embodiment, an expansion pattern EP may be formed with the power transfer wiring. For example, the expansion pattern EP may extend from the first wiring portion TP1 or the first transfer portion TP1. Thus, the expansion pattern EP may be defined by a portion of the power transfer wiring. In an embodiment, the expansion pattern EP may have a stacked structure including an aluminum layer and a titanium layer. When the expansion pattern EP is formed from the upper conductive layer of the power transfer wiring, a thickness of the expansion pattern EP is smaller than an entire thickness of the power transfer wiring including the upper conductive layer and the lower conductive layer.

The expansion pattern EP may be disposed in the organic-removed area ORA. Thus, the expansion pattern EP may contact the third insulation layer 140 including an inorganic material. The expansion pattern EP may overlap at least a portion of the fan-out lines FL1 and FL2.

The second source metal layer SM2 may be dry-etched by using an etching gas. After a portion of the second source metal layer SM2 is removed, the third insulation layer 150 disposed under the portion of the second source metal layer SM2 may be further etched. As a result, a thickness t5 of a further etched portion of the third insulation layer 140, which is disposed in the organic-removed area ORA, may be smaller than a thickness t3 of a portion of the third insulation layer 140, which overlaps the expansion pattern EP.

In another embodiment, an expansion pattern may have a double-wiring structure including a plurality of layers formed from same layers as the first source metal pattern and the second source metal pattern.

Figure 9:
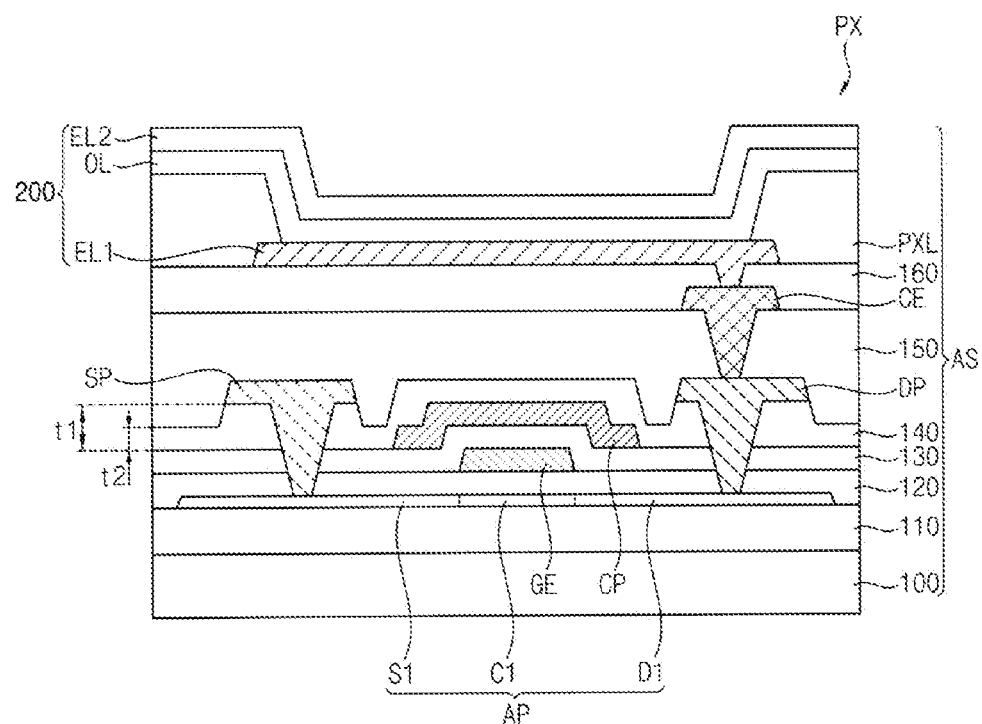
Figure 10:
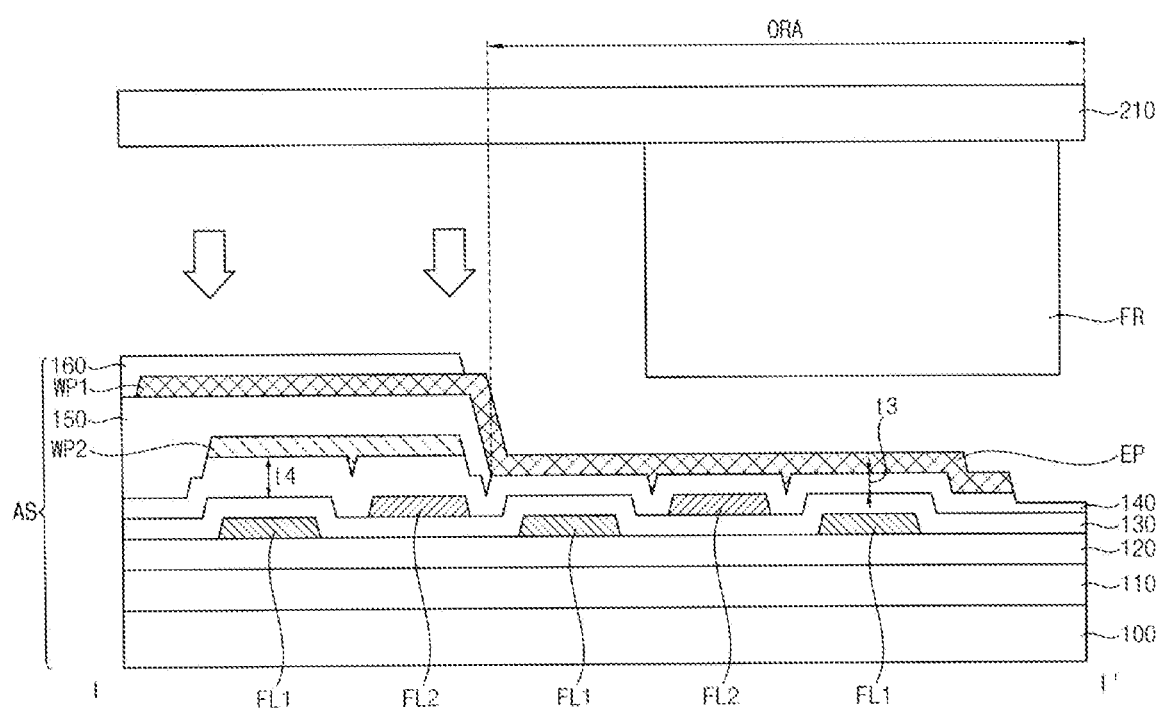

Referring to FIGS. 9 and 10, a fifth insulation layer 160 is formed in the pixel area PX to cover the second source metal pattern. The fifth insulation layer 160 is not disposed in the organic-removed area ORA. A pixel-defining layer PDL and an organic light-emitting diode 200 are formed on the fifth insulation layer 160.

Thereafter, an array substrate including the organic light-emitting diode 200 is combined with an encapsulation substrate 210.

In an embodiment, a sealing material FR is provided on the organic-removed area. The sealing material FR is disposed between the array substrate AS and the encapsulation substrate 210.

For example, the sealing material FR may be combined with a surface of the encapsulation substrate 210. However, embodiments are not limited thereto. For example, after the sealing material FR is provided on the array substrate AS, the encapsulation substrate 210 may be disposed on the sealing material FR. For example, a frit past or the like may be coated on a sealing area by screen printing, which uses a mask including an opening corresponding to the sealing area, to provide the sealing material FR on the array substrate AS.

For example, the sealing material FR may be heated by heat, UV, laser or the like while the sealing material FR contacts the array substrate AS and the encapsulation substrate 210. As a result, the array substrate AS is combined with the encapsulation substrate 210, and the sealing material FR is sintered to form a sealing member.

For example, the sealing material FR may include a glass frit. For example, the glass frit may include an oxide powder, a binder and a solvent. For example, the oxide powder may include lead oxide (PbO), silicon oxide ($SiO_2$), zinc oxide (ZnO), bismuth oxide ($Bi_2O_3$), boron oxide ($B_2O_3$, $B_2O_8$), iron oxide ($Fe_2O_3$), aluminum oxide ($Al_2O_3$) or a combination thereof.

In an embodiment, the expansion pattern EP is provided under the sealing member. Thus, consumption of an inorganic layer covering the fan-out lines FL1 and FL2 may be minimized, and a heat may be dissipated in the process of forming the sealing member. Thus, damage to the inorganic layer may be reduced or prevented, and reliability of a display device may be improved.

In an embodiment, the expansion pattern EP may be formed from a same layer as the second source metal pattern, and may be continuously connected to the power transfer wiring. However, embodiments are not limited thereto. Hereinafter, embodiments including an expansion pattern with various configurations are explained hereinbelow.

Figure 11:
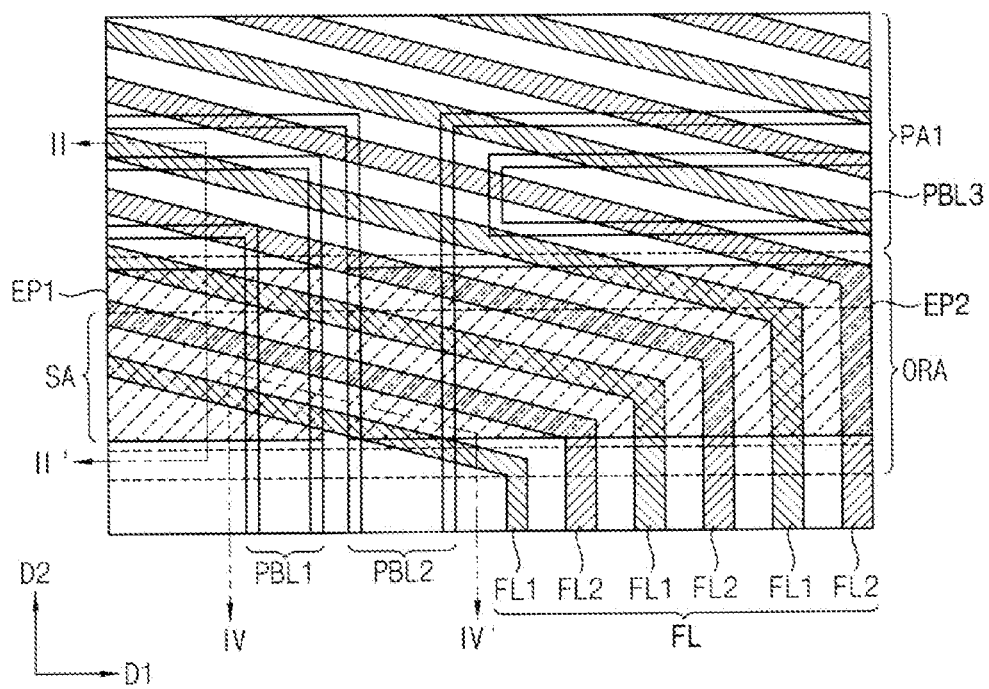
FIG. 11 is an enlarged plan view illustrating a sealing area of a display device according to an embodiment.
Figure 12A:
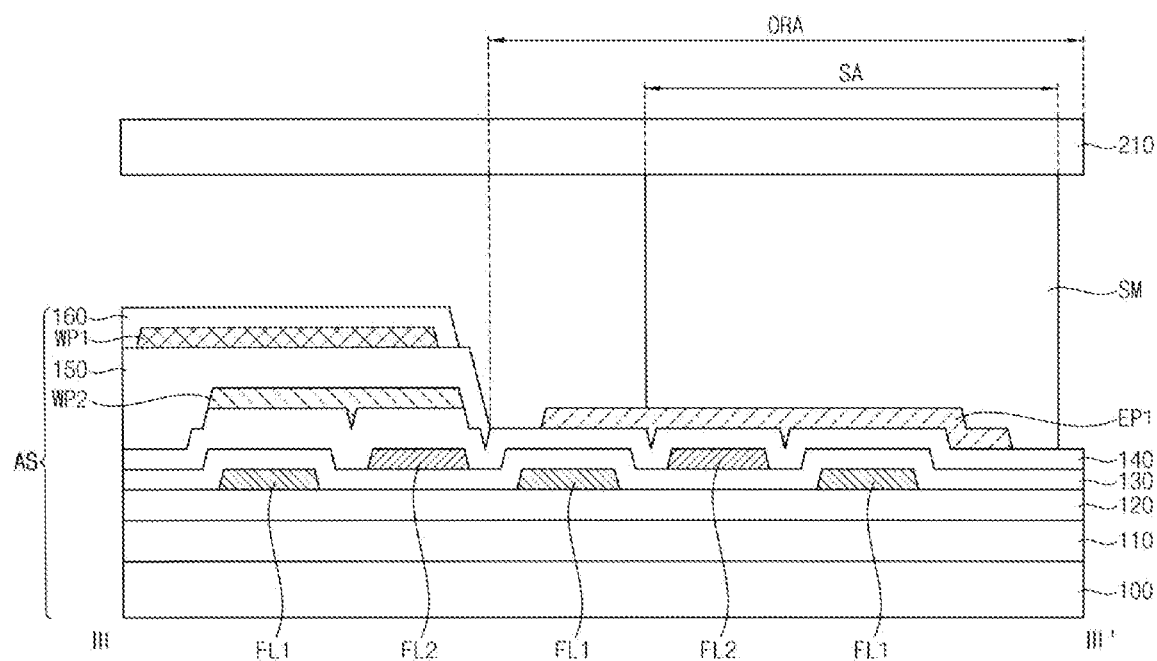
FIG. 12A is a cross-sectional view taken along the line III-III' of FIG. 11.
Figure 12B:
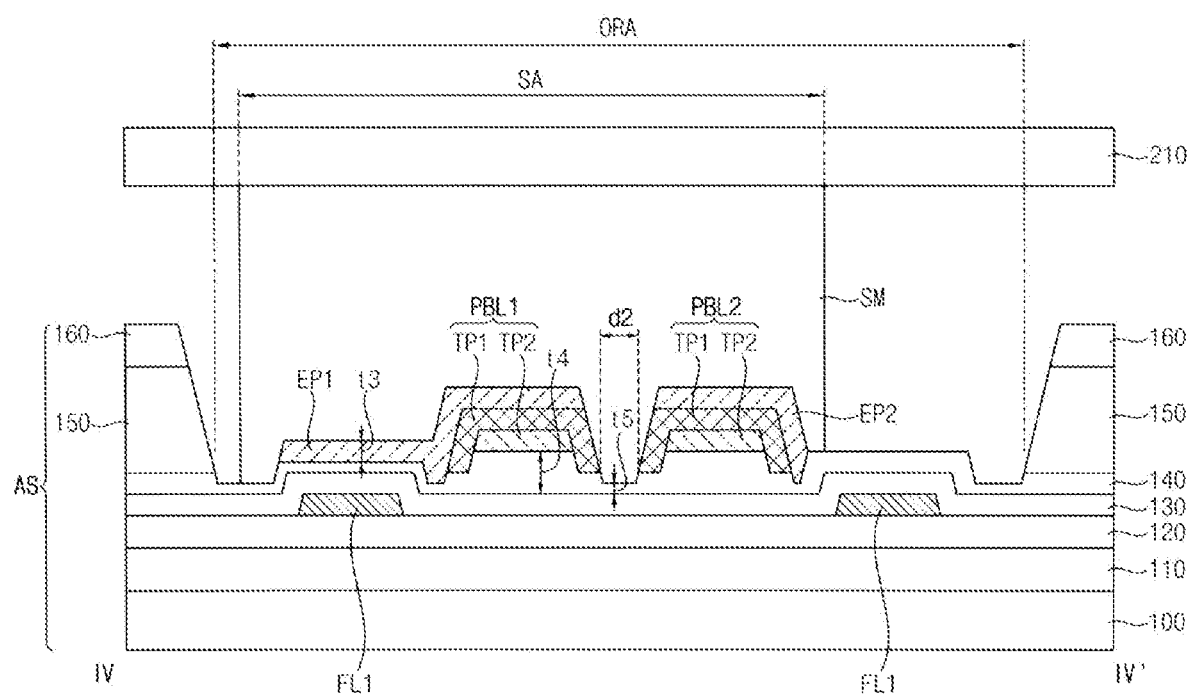
FIG. 12B is a cross-sectional view taken along the line IV-IV' of FIG. 11.

FIG. 11 is an enlarged plan view illustrating a sealing area of a display device according to an embodiment. FIG. 12A is a cross-sectional view taken along the line III-III' of FIG. 11. FIG. 12B is a cross-sectional view taken along the line IV-IV' of FIG. 11.

Referring to FIGS. 11, 12A and 12B, an expansion pattern may be formed from a different layer from a power transfer wiring.

For example, the expansion pattern may be formed from a same layer as a first electrode of an organic light-emitting diode disposed in a pixel area. For example, the expansion pattern may have a multi-layered structure including silver and a transparent conductive oxide such as ITO or the like. The expansion pattern may be disposed in the organic-removed area ORA and may extend along a first direction D1.

The expansion pattern may be disposed between a sealing member SM and a power transfer wiring in a sealing area SA. The expansion pattern may contact the sealing member SM, and may contact power transfer wirings PBL1 and PBL2. For example, the expansion pattern may include a first expansion pattern EP1 contacting a first power transfer wiring PBL1 and a second expansion pattern EP2 contacting a second power transfer wiring PBL2 and spaced apart from the first expansion pattern EP1.

When the expansion patterns EP1 and EP2 are formed from a same layer as the first electrode of the organic light-emitting diode, a thickness t3 of a lower insulation layer 140, which contacts the expansion patterns EP1 and EP2 and is disposed under the expansion patterns EP1 and EP2, may be smaller than a thickness t3 of the lower insulation layer 140, which contacts the expansion pattern EP in FIG. 4B. For example, a thickness t3 of a first portion of the lower insulation layer 140, which contacts the expansion patterns EP1 and EP2 and is disposed under the expansion patterns EP1 and EP2, may be substantially same as a thickness t5 of a second portion of the lower insulation layer 140, which contacts the sealing member SM, and may be smaller than a thickness t4 of a third portion of the lower insulation layer 140, which contacts the power transfer wirings PBL1 and PBL2.

The expansion patterns EP1 and EP2 may dissipate heat transferred to the lower insulation layer 140 in the process of forming the sealing member. Thus, damage to an inorganic layer thereunder may be reduced or prevented, and reliability of a display device may be improved.

Figure 13:
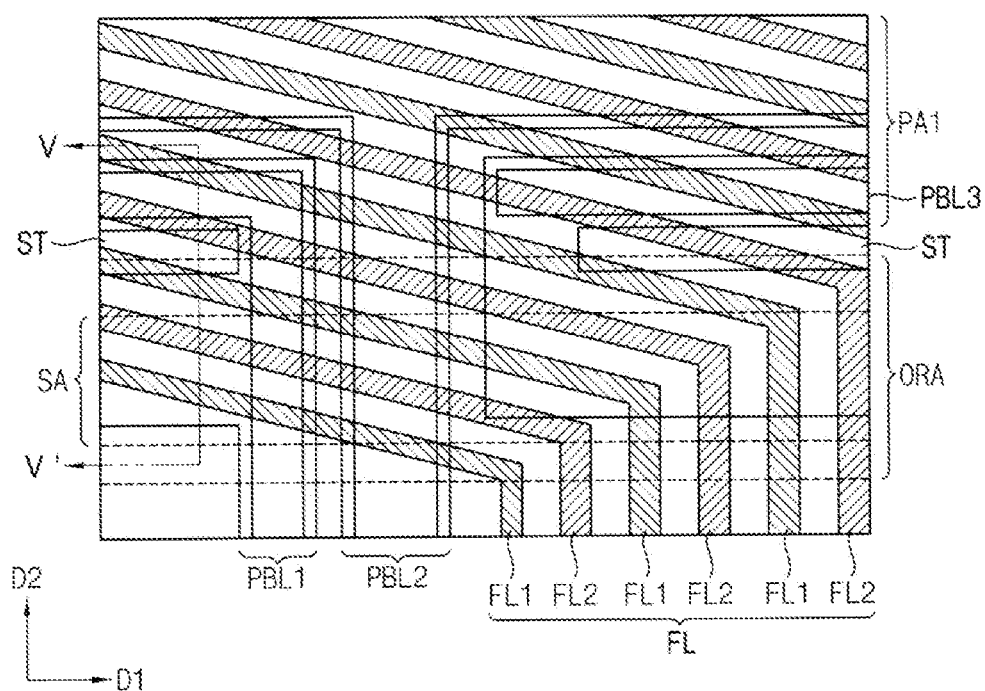
FIG. 13 is an enlarged plan view illustrating a sealing area of a display device according to an embodiment.
Figure 14:
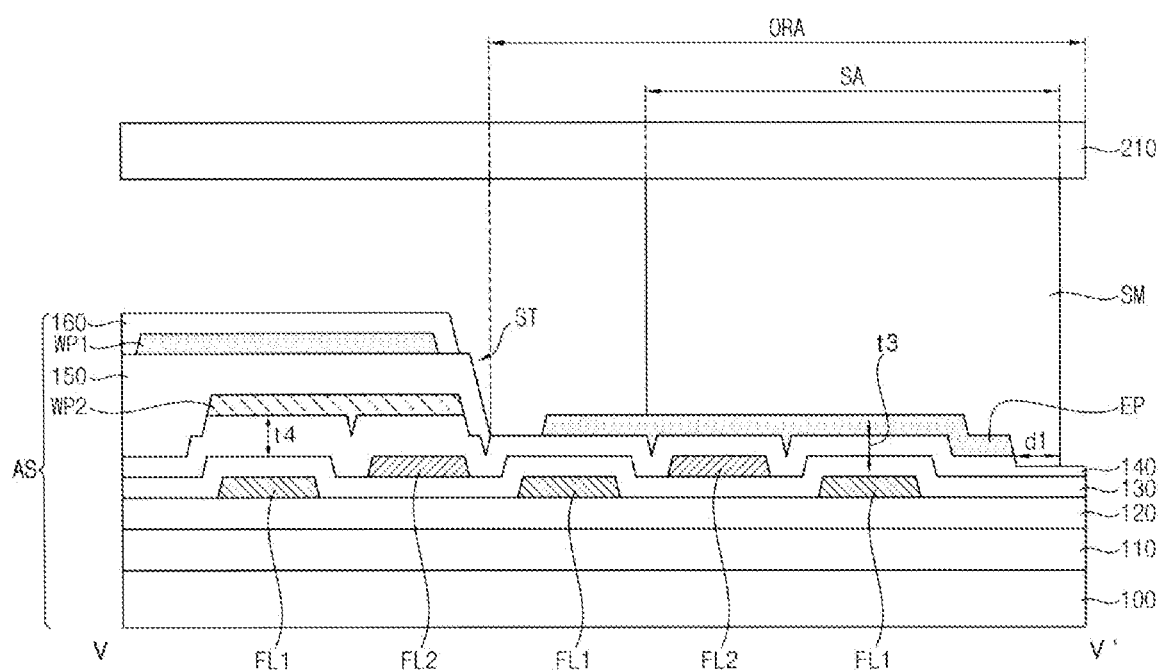
FIG. 14 is a cross-sectional view taken along the line V-V' of FIG. 13.
Figure 15:
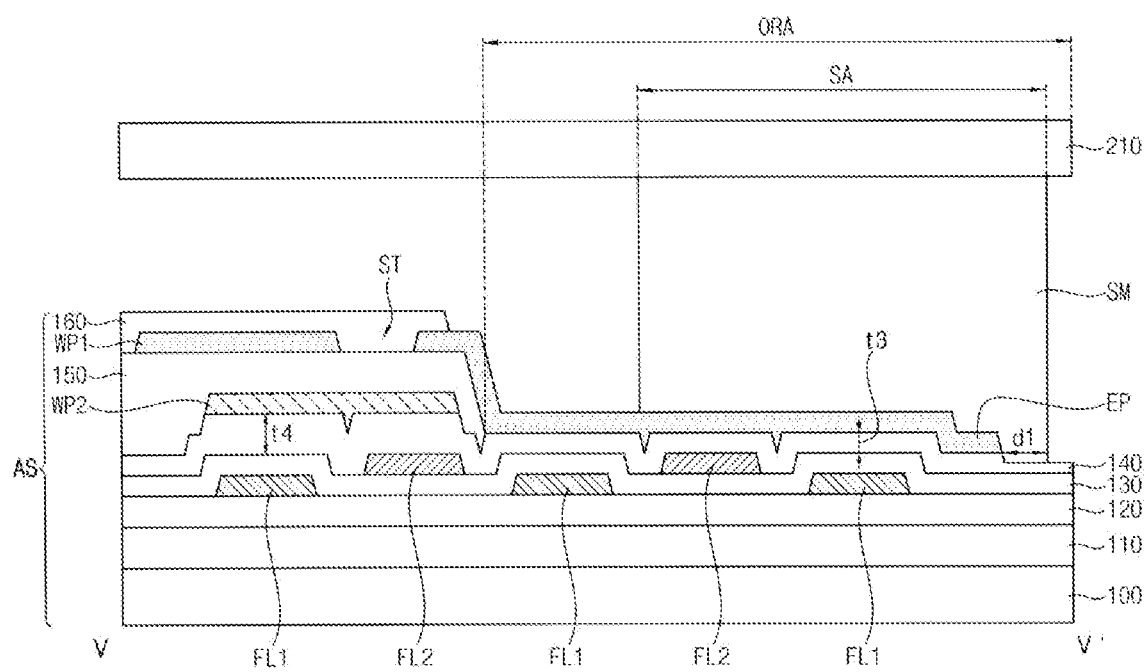
FIG. 15 is an enlarged plan view illustrating a sealing area of a display device according to an embodiment.
Figure 16:
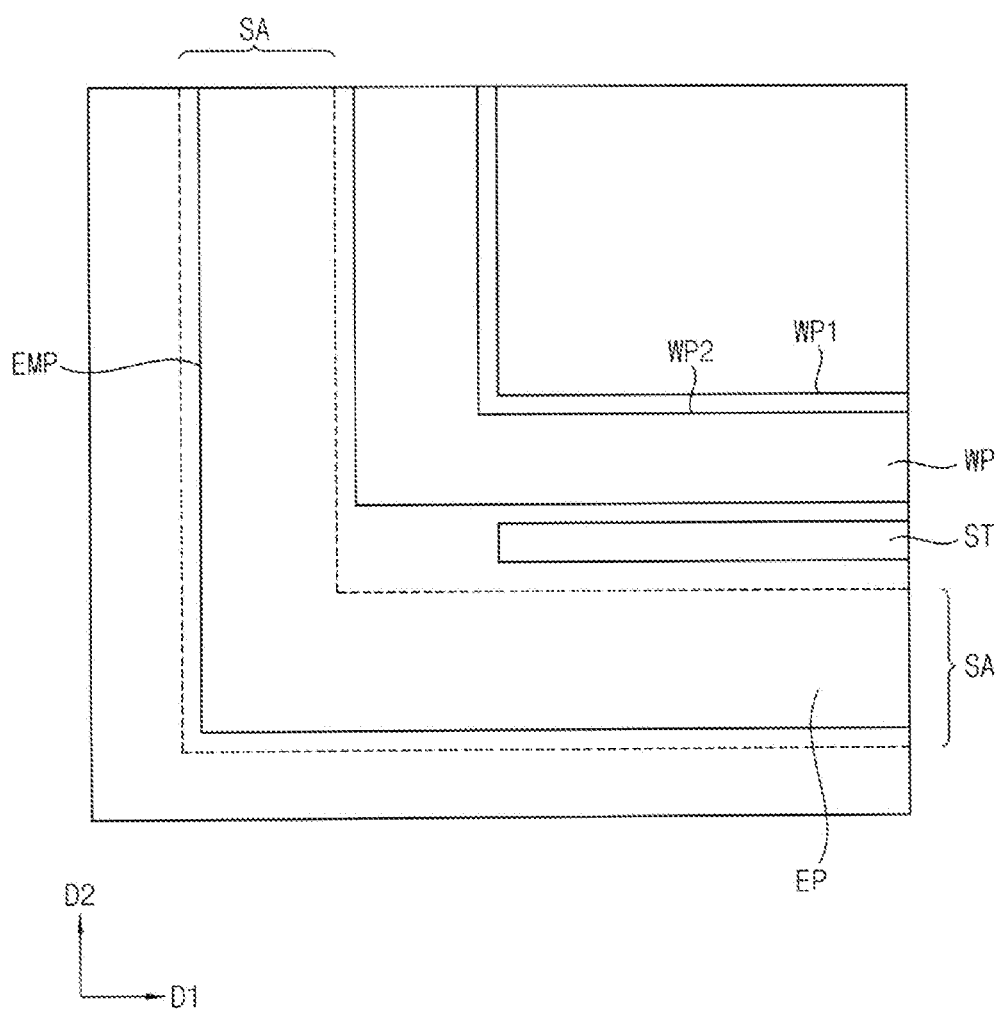
FIG. 16 is an enlarged plan view illustrating a corner area of a display device according to an embodiment.

FIG. 13 is an enlarged plan view illustrating a sealing area of a display device according to an embodiment. FIG. 14 is a cross-sectional view taken along the line V-V' of FIG. 13. FIG. 15 is an enlarged plan view illustrating a sealing area of a display device according to an embodiment. FIG. 16 is an enlarged plan view illustrating a corner area of a display device according to an embodiment.

Referring to FIGS. 13 and 14, a slit ST may be formed between an expansion pattern EP and a first wiring portion WP1 of a power transfer wiring.

For example, a first power transfer wiring PBL1 may include a first wiring portion WP1 and a second wiring portion WP2, which extend along a first direction D1 in a first peripheral area PA1. The expansion pattern EP may overlap an organic-removed area ORA, may be disposed in a same layer as the first wiring portion WP1, and may extend along the first direction D1. The first wiring portion WP1 and the expansion pattern EP may be spaced apart from each other along a second direction D1 orthogonal to or substantially orthogonal to the first direction D1 to define a slit ST therebetween. The slit ST may extend along the first direction D1.

In an embodiment, the slit ST may expose an organic insulation layer 150 disposed under the first wiring portion WP1. For example, the slit ST may expose at least a portion of an upper surface and a side surface of the organic insulation layer 150. Thus, outgassing of the organic insulation layer 150 may be improved.

Referring to FIG. 14, an expansion pattern EP may be disposed in an organic-removed area ORA to entirely contact an inorganic insulation layer 140 disposed thereunder. However, embodiments are not limited thereto. For example, an expansion pattern EP may extend over an organic insulation layer 150 as illustrated in FIG. 15.

Referring to FIG. 16, an expansion pattern EP may be spaced apart from a first wiring portion WP1 by a slit ST, and may extend along a first direction D1. The expansion pattern EP may be connected to an edge metal pattern EMP, which extends along a second direction D2 crossing the first direction D1, in a corner area. The edge metal pattern EMP may overlap a sealing area SA, and may be connected to the first wiring portion WP1. The edge metal pattern EMP may reflect a laser provided thereto in the process of forming a sealing member thereby increasing sintering speed of the sealing member.

The above embodiments provide an organic-light emitting display device. However, embodiments are not limited thereto. For example, embodiments may be applied for other display devices such as a liquid crystal display device, a electroluminescent display device, a micro LED display device or the like.

Embodiments may be applied to various display devices. For example, embodiment may be applied to vehicle-display device, a ship-display device, an aircraft-display device, portable communication devices, display devices for display or for information transfer, a medical-display device, etc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
an array substrate including a pixel array disposed in a display area;
an encapsulation substrate; and
a sealing member disposed between the array substrate and the encapsulation substrate to combine the array substrate with the encapsulation substrate,
wherein the array substrate includes:
a signal transfer wiring overlapping the sealing member and electrically connected to the pixel array;
an insulation layer covering the signal transfer wiring and including an inorganic material;
a power transfer wiring disposed on the insulation layer, overlapping the sealing member and having a multi-wiring structure; and
an expansion pattern connected to the power transfer wiring, having a thickness smaller than a thickness of the power transfer wiring and overlapping the sealing member and the signal transfer wiring, wherein an outer edge of the expansion pattern is disposed within a sealing area where the sealing member is disposed,
wherein the power transfer wiring includes an upper conductive layer and a lower conductive layer, and the expansion pattern is disposed in a same layer as the upper conductive layer of the power transfer wiring,
wherein the expansion pattern or the upper conductive layer of the power transfer wiring fully covers an upper surface the lower conductive layer of the power transfer wiring in the sealing area.

2. The display device of claim 1, wherein each of the upper conductive layer and the lower conductive layer includes an aluminum layer.

3. The display device of claim 2, wherein the expansion pattern is continuously connected to the upper conductive layer of the power transfer wiring.

4. The display device of claim 1, wherein the signal transfer wiring includes at least molybdenum.

5. The display device of claim 1, wherein the insulation layer includes a first portion which contacts the expansion pattern, a second portion which contacts the sealing member, and a third portion which contacts the power transfer wiring, the first to third portions including a same material and being arranged in a lateral direction in a same layer, wherein a thickness of the first portion is larger than a thickness of the second portion and smaller than a thickness of the third portion.

6. The display device of claim 5, wherein a thickness difference of the first portion and the second portion is at least 500 Å.

7. The display device of claim 1, wherein the outer edge of the expansion pattern extends along an outer edge of the sealing area.

8. The display device of claim 1, wherein the upper conductive layer of the power transfer wiring
is disposed in a peripheral area between the display area and the sealing area, and
the lower conductive layer of the power transfer wiring is vertically spaced apart from the upper conductive layer of the power transfer wiring by an organic insulation layer.

9. The display device of claim 8, wherein the expansion pattern is continuously connected to the upper conductive layer of the power transfer wiring.

10. The display device of claim 8, wherein the expansion pattern is spaced apart from the upper conductive layer of the power transfer wiring to define a slit, which exposes a portion of the organic insulation layer.

11. The display device of claim 10, wherein a portion of the expansion pattern is disposed on the organic insulation layer.

12. The display device of claim 10, wherein the array substrate further includes an edge metal pattern, which extends along a direction crossing a lengthwise direction of the expansion pattern and overlaps the sealing member, wherein the edge metal pattern is connected to the expansion pattern in a corner area of the array substrate.

13. The display device of claim 1, wherein the pixel array includes an organic light-emitting diode.

14. The display device of claim 1, wherein the signal transfer wiring transfers a data signal to the pixel array.

15. The display device of claim 1, wherein the power transfer wiring transfers a power voltage to the pixel array.

* * * * *